April 28, 1959 A. UHLIR, JR 2,884,607

SEMICONDUCTOR NONLINEAR CAPACITANCE DIODE

Filed April 18, 1958

INVENTOR
A. UHLIR, JR.
BY
H. W. Lockhart
ATTORNEY

United States Patent Office 2,884,607

Patented Apr. 28, 1959

2,884,607

SEMICONDUCTOR NONLINEAR CAPACITANCE DIODE

Arthur Uhlir, Jr., Mountainside, N.J., assignor to Bell Telephone Laboratories, Incorporated, New York, N.Y., a corporation of New York Application April 18, 1958, Serial No. 729,401

7 Claims. (Cl. 333—98)

Figure 1:
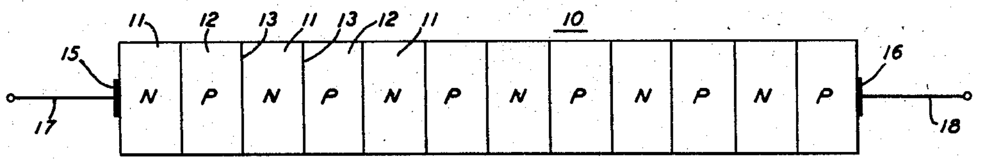

This invention relates to semiconductive devices and, more particularly, to a semiconductor P-N junction device exhibiting a nonlinear capacitance characteristic.

A semiconductor junction defined by the boundary between regions of P-type and N-type conductivity material is a capacitor under certain conditions. This junction capacitance arises from the electrical charge of the depletion layer or space-charge region associated with the junction. The space-charge region identifies a volume adjoining the junction on both sides within which the net fixed charge arising from the presence of ionized impurity atoms is not neutralized by mobile charge carriers. Outside of the depletion layer the mobile carriers, holes in the P-type material and electrons in the N-type, are present in almost exactly the right numbers to neutralize the fixed charges.

If the junction is biased slightly in the forward or reverse direction by applying a voltage to a contact on one side of the junction, this voltage urges the hole and electron distributions to move toward or away from each other, respectively. Additional holes and electrons enter or leave the semiconductor at the contacts to maintain the neutrality of the P-type and N-type regions as the depletion layer narrows or widens. Therefore, a certain amount of charge is introduced at the terminals of the device and, neglecting recombination or generation of charge carriers, the same amount of charge returns if the applied voltage is changed back to zero. Thus, the semiconductor junction device is like a capacitor. The relation between the applied voltage and the amount of charge introduced at the terminals is nonlinear; i.e. the capacitance, defined as the rate of change of charge as voltage is changed, depends upon the voltage.

However, although single junction semiconductor devices have been disclosed previously as capacitance elements, a single junction device has limitations for certain applications. In order to accommodate larger amounts of power, the single junction may be increased in area. However, this may lower the impedance level of the device at high frequencies, such as are encountered in microwave circuits, to inconveniently low values. The desired high impedance level is restored in accordance with this invention by arranging a number of P-N junctions of particular kinds in series.

Therefore, one object of this invention is an improved semiconductor capacitance diode.

A more specific object is a semiconductor capacitance diode capable of handling relatively large amounts of power.

Another object is a semiconductor diode exhibiting a nonlinear capacitive response both at relatively high power levels and at high frequencies.

A further object of this invention is a nonlinear semiconductor capacitance element of simplified construction for attaining the foregoing objects.

In accordance with one embodiment of this invention, a semiconductor capacitance diode comprises a single crystal semiconductive body comprising a series of regions alternately of P and N-type conductivity defining P-N junctions therebetween and two substantially ohmic or low resistance contacts to the two terminal regions thereof. Advantageously, the impurity concentration within each region is arranged so that the concentration gradient adjacent successive junctions is alternately gradual and abrupt. Such junctions are referred to, respectively, as graded junctions and step junctions.

Figure 2:
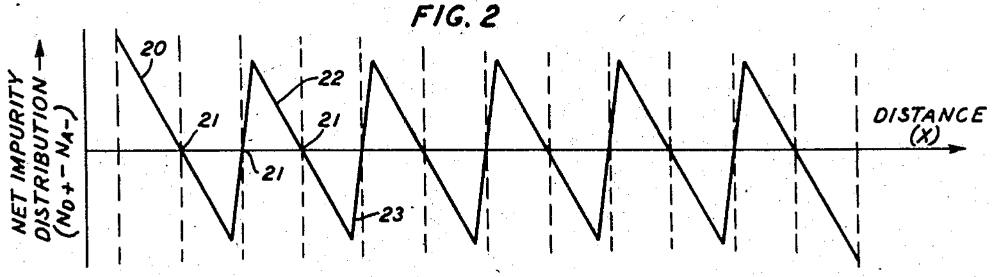
Figure 3:
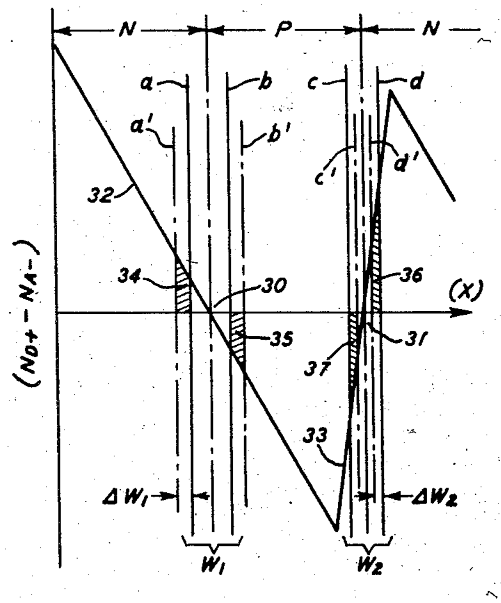
Figure 4:
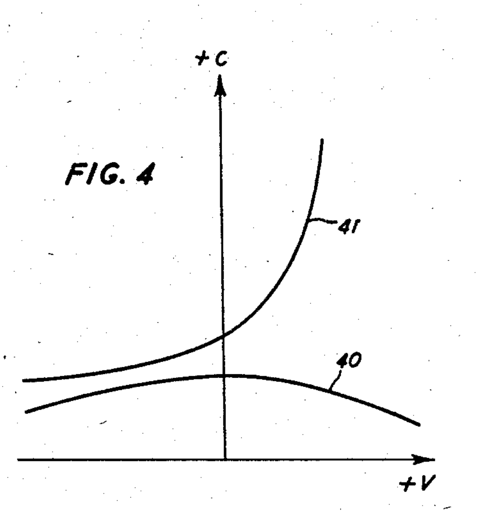
Figure 5:
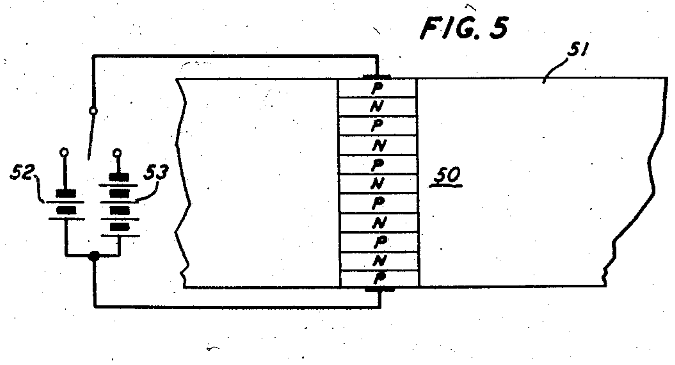

A better understanding of the invention may be had from the following more detailed discussion taken in conjunction with the drawing in which:

Fig. 1 is a diagrammatic representation of a multijunction semiconductor diode in accordance with this invention and Fig. 2 depicts in graphic form the impurity distribution in the device of Fig. 1 and Fig. 3 is a graph showing the impurity distribution across two adjacent junctions of the device of Fig. 1 in greater detail and Fig. 4 is a graph of the charge versus voltage characteristic of the device of Fig. 1 and Fig. 5 is a diagram of the device in accordance with this invention in a wave guide section for use as a switch.

The diode 10 of Fig. 1 comprises a single crystal of silicon containing twelve contiguous regions 11 and 12 alternately of N and P-type conductivity, respectively, defining eleven semiconductor junctions 13 therebetween. Although the structure shown has an even number of opposite conductivity type regions 11 and 12, the invention may be embodied equally well in a device having an odd number of regions. Plated electrodes 15 and 16 are applied to the terminal regions of the device to provide low resistance contact thereto enabling the attachment of external leads 17 and 18.

In Fig. 2, the sawtooth graph 20 represents the net concentration of impurity atoms at various locations along the length of the junction diode 10. The points 21 where the graph crosses the horizontal axis indicate a plane throughout which the acceptor and donor impurities are substantially in balance thus defining the stoichiometric junction. It can be seen that the rate of change in impurity concentration of the N-P junctions, reading from left to right, as represented by the slope 22 is much less than the rate of change in concentration across the P-N junctions as depicted by the slope 23. In other words, the N-P junctions are "graded" junctions and the P-N junctions are "step" junctions. It will be appreciated that the graph of Fig. 2 represents to some extent an idealization and that the actual curve for any given cross-section may depart slightly from the straight lines and angular intersections shown.

Further, the structure of Fig. 1 is exaggerated in certain respects for clarity. For example, the device of Fig. 1 in accordance with one method, is made from a single crystal produced by the pulling technique from a molten bath of silicon containing controllable concentrations of significant impurities. The arrangement of alternating graded and step junctions is attained by the method known as rate-growing wherein the impurity gradient at the junction region is controlled by adjusting the incremental growth rate variation as it passes through the intrinsic semiconductor forming growth rate. This and related methods for accomplishing this result are well known in the art and are disclosed, for example, in United States Patent 2,739,088 issued to W. G. Pfann and United States Patent 2,822,308 issued February 4, 1958 to R. N. Hall.

The device of Fig. 1 therefore, may comprise a body having a width of .010 inch in diameter. In thickness the body is of a size to accommodate a plurality of P and N-type regions with an average spacing between junctions of about .007 inch. Thus the device of Fig. 1 comprises a body having a thickness of .012 inch. Bodies of greater thickness and larger number of junctions may be produced by this same method. The terminal connections 15 and 16 are made advantageously by plating to produce a low resistance contact, for example, as disclosed in Patent 2,793,420 issued May 28, 1957, to R. L. Johnston and R. L. Rulison.

Referring to Fig. 3 which represents a portion of the graph of Fig. 2 to an enlarged scale the solid lines *a* and *b* represent the limits of the depletion layer associated with the graded P-N junction 30 with no external bias and the lines *c* and *d* similarly apply with respect to the steeply-graded N-P junction 31. Typically, the line 32 may represent an impurity distribution of about $10^{22}$ atoms per cubic centimeter per centimeter of distance ($x$). The line 33 depicts an impurity distribution of a steeply-graded and relatively abrupt junction. It will be appreciated that, as a matter of definition, for a step junction the line 33 would be practically vertical, but that within the contemplation of this invention the N-P junction may have an impurity distribution ranging from that shown to that of a step junction. Thus, as shown, the depletion layer capacitance of the N-P junction 31 is greater per unit area than that of the graded P-N junction 30 because $w_2$ is less than $w_1$. In a series connection of capacitors, elastances (reciprocal capacitances) are additive. Thus, the elastance of the N-P junction is much less than the elastance of the graded P-N junction, so the elastance of the latter dominates the series of junctions in Fig. 1.

The effect of the application of external bias upon the depletion-layer boundaries is represented by the dotted lines *a'*, *b'* and *c'*, *d'*. If the graded P-N junction is biased in the reverse direction by applying to the P-type contact of Fig. 1, a voltage which is negative with respect to the N-type contact, the depletion layer of the graded P-N junction will be widened by an amount represented by twice $\Delta_{w_1}$. The same bias applied to the structure of Fig. 1 will forward bias the N-P junction and will narrow the depletion layer associated therewith by an amount represented by twice $\Delta_{w_2}$.

In general, the change in the width of the depletion layers is in the relation such that the shaded area 34 of $\Delta_{w_1}$ is approximately equal to the shaded area 36 of $\Delta_{w_2}$ and likewise the area 35 approximates the area 37 so that the same amount of charge passes through each junction. Thus, it can be seen that for a given applied bias the narrowing of the depletion layer of the step junction is less than the widening of the depletion layer of the graded junction. Consequently, because the elastance is proportional to the width of the depletion layer, the elastance of the step junction will change less with changes in applied voltages than will the capacitance of the graded junction.

By way of comparison, it is apparent that if the impurity distribution across the N-P junction were graded rather than abrupt, that is if the slope of the line 33 were the exact negative of the slope of line 32 the change in elastance, for a given change in voltage, of the P-N junction 30 would in large part, oppose the change in elastance of the N-P junction 31. Consequently, a device having a plurality of linearly-graded semiconductor junctions of approximately equal gradient would exhibit an only moderately nonlinear characteristic having the symmetrical form of the curve 40 of Fig. 4 wherein applied voltage is plotted against capacitance.

A much more useful characteristic, however, is represented by the curve 41 of Fig. 4 which describes graphically capacitance of the alternating graded and step junction diode of Fig. 1 as voltage is varied. This capacitance is the reciprocal of the sum of all the elastances of the N-P and P-N junctions. Thus, in operation, as the voltage applied across the diode is changed, the elastance of all the junctions changes. The elastance change of the step junction is opposite in direction to that of the graded junctions. However, the elastance of the step junctions is less than that of the graded junctions and their elastance change does not balance the capacitance change of the graded junctions. As a result, an overall capacitance variation with voltage is obtained which departs from linearity in a most advantageous fashion in a device which has a suitably high impedance level as a result of the series of semiconductor junctions. This renders the device very useful in microwave systems.

For example, the nonlinear capacitor diode of this invention may be used as a switch in microwave systems. In Fig. 5 a nonlinear capacitance diode 50 in accordance with this invention is shown diagrammatically installed so that the semiconductor element spans the height of a wave guide 51. The diode is arranged so that the planes of the several junctions are parallel to the direction of transmission. Thus, the passage of microwave energy through the wave guide 51 will be a function of the capacitance of the diode 50. In other applications the diode may be installed so as to occupy more or less than simply the span of the wave guide.

In one form as shown, the diode terminals are connected to two voltage sources 52 and 53 of permanent and different value and corresponding to biases which will place the diode in the on and off conditions with respect to impinging wave energy. Although selection of the desired bias voltage is shown as by means of a simple switch 54 it is apparent that a variety of means may be substituted for selecting the voltage to be applied to the diode.

In this connection, a further advantage of the particular form of a nonlinear capacitor diode in accordance with this invention arises from the high cutoff frequency attainable as a result of the extremely close spacing of the junctions within the diode. Further because of the reduction in the number of low-resistance contacts required, namely two, as compared to a serial array of a number of separate devices, the series resistance of the device is minimized.

Another possible use of the invention is as the variable reactance element in a parametric amplifier of the kind known to workers in the art.

It is to be understood that the above-described embodiments are but illustrative of the principles of the invention. Of course, it will be obvious that one can depart from a regular pattern of relatively gradual and relatively abrupt junctions to some extent without departing from the spirit of the invention. Numerous other arrangements may be devised by those skilled in the art without departing from the spirit and scope of the invention.

What is claimed is:

1. A semiconductor device comprising a single crystal body of semiconductive material said body including a plurality in excess of three of serially arranged regions alternately of P and N-type conductivity defining therebetween a plurality of semiconductor junctions, every other one of said junctions having a relatively gradual change in impurity concentration thereacross, the remainder of said junctions having a relatively abrupt change in impurity concentration thereacross, and low resistance contacts to the two terminal regions of said body.

2. A semiconductor device comprising a single crystal body of semiconductive material selected from the group consisting of germanium and silicon said body including an odd number in excess of three of serially arranged regions alternately of opposite conductivity type defining therebetween an even number of semiconductor junctions, every other one of said junctions having a relatively gradual change in impurity concentration thereacross, the remainder of said junctions having a relatively abrupt change in impurity concentration thereacross, and substantially ohmic electrodes attached to the two terminal regions of said body.

3. A semiconductor device comprising a single crystal body of semiconductor material selected from the group consisting of germanium and silicon said body including an even number in excess of two of serially arranged regions alternating of P and N-type conductivity defining therebetween an odd number of semiconductor junctions every other one of said junctions having a relatively gradual change in impurity concentration thereacross, the remainder of said junctions having a relatively abrupt change in impurity concentration thereacross and substantially ohmic electrodes attached to the two terminal regions of said body.

4. A nonlinear capacitance diode comprising a single crystal body of semiconductive material, said body including a plurality in excess of three of serially arranged regions of alternating P and N-type conductivity defining therebetween a plurality of semiconductor junctions, every other one of said junctions having a relatively gradual change in impurity concentration thereacross, the remainder of said junctions having a relatively abrupt change in impurity concentration thereacross, substantially ohmic electrodes attached to the two terminal regions of said body, and voltage means connected between said electrodes.

5. A nonlinear capacitance diode in accordance with claim 4 including means for changing the magnitude of the voltage means.

6. Apparatus for controlling electromagnetic energy comprising in combination, a wave guide in which the electromagnetic wave energy is propagating, and a nonlinear capacitor diode mounted within said wave guide, said diode comprising a single crystal body of semiconductive material and including a plurality in excess of three of serially arranged regions alternately of P and N-type conductivity defining therebetween a plurality of semiconductor junctions, every other one of said junctions having a relatively gradual change in impurity concentration thereacross, the remainder of said junctions having a relatively abrupt change in impurity concentration thereacross, the plane of said junctions being substantially parallel to the direction of energy propagation in said wave guide, a substantially ohmic electrode attached to each of the two terminal regions of said body, and voltage means connected between said electrodes including means for varying the magnitude of said voltage.

7. Apparatus in accordance with claim 6 wherein said diode completely spans the height of said wave guide.

No references cited.